United States Patent [19]

Sprenkle

[11] 3,971,419
[45] July 27, 1976

[54] DRESSING FINGER FOR AUTOMATIC WIRING MACHINES

[75] Inventor: George J. Sprenkle, Phoenixville, Pa.

[73] Assignee: Burroughs Corporation, Detroit, Mich.

[22] Filed: July 31, 1975

[21] Appl. No.: 600,586

[52] U.S. Cl. .............................. 140/93 R; 29/203 B; 29/203 MW; 140/124; 242/7.17
[51] Int. Cl.² ...................... B21F 3/04; B21F 15/04; B21F 45/00
[58] Field of Search ...... 29/203 B, 203 D, 203 MW, 29/203 S; 140/93, 115, 122, 124; 242/7.09, 7.17, 7.18

[56] References Cited
UNITED STATES PATENTS

| | | | |
|---|---|---|---|
| 2,969,827 | 1/1961 | Rosenthal et al. ............... | 140/93 R |
| 3,143,307 | 8/1964 | Baker ............................... | 242/7.17 |
| 3,185,184 | 5/1965 | Loy et al. ........................ | 140/93 R |
| 3,246,381 | 4/1966 | Etchison et al. ................. | 242/7.17 |
| 3,435,858 | 4/1969 | Taysom et al. .................. | 140/93 R |
| 3,479,720 | 11/1969 | Bohannon et al. ............... | 140/124 |
| 3,514,835 | 6/1970 | Etchison et al. ................. | 140/93 R |
| 3,516,140 | 6/1970 | Bohannon ........................ | 29/203 B |
| 3,716,080 | 2/1973 | Scaddan et al. ................. | 140/124 |
| 3,803,696 | 4/1974 | Harms et al. .................... | 29/203 B |

*Primary Examiner*—C.W. Lanham
*Assistant Examiner*—E. M. Combs
*Attorney, Agent, or Firm*—Francis A. Varallo; Edward J. Feeney, Jr.; Kevin R. Peterson

[57] ABSTRACT

The present disclosure describes an improved dressing finger for use with automatic wiring machines. Such machines are used to make solderless wrapped connections on terminals emanating from a common plane. The dressing finger which is used to form predetermined wire patterns is associated with a wrap tool which makes the actual connection. In present day machines, the distance relationship between wrap tool and dressing finger is fixed in one axis and the terminal grid arrangement which is dependent thereon is likewise fixed. The dressing finger of the present invention permits a combination of grids or fixed grids within a predetermined range, thereby providing greater flexibility in the design of the terminal panel.

10 Claims, 9 Drawing Figures

DRESSING FINGER FOR AUTOMATIC WIRING MACHINES

BACKGROUND OF THE INVENTION

Machines for automatically attaching interconnecting wiring to terminals arranged on a panel by means of solderless wrapped connections are well known in the electronic and electrical industries. The Automatic Wire-Wrap Machine, Model 14FV, manufactured by the Gardner-Denver Company of Grand Haven, Michigan is an example of such a machine. In general, the machine consists of movable carriages containing wrapping tool assemblies and dressing fingers that are positioned to form a desired wire pattern. The dressing fingers are capable of being positioned in both the "X" and "Y" axes in small incremental distances with respect to the terminals emanating from the panel being wrapped. Also, the dressing fingers may be suitably positioned along one of said axes, for example, the Y axis, with respect to its associated wrap tool. However, the distance relationship between the finger and tool in the X axis is a fixed dimension. Such a fixed relationship dictates the X-Y grid size for terminal placement, which must be in whole increments of the aforesaid dimension. Such an arrangement severely limits the design of the terminal panel.

The dressing finger described and claimed herein is a replacement for the finger used on such present day machines. It allows a range of grid sizes to be employed on the terminal panel, including a combination of grid pattern sizes in both axes, within the range accommodated by the dressing finger. Heretofore, only one grid size could be used on a panel layout, or if different sizes were used on a panel they were confined to respective definitive areas thereof. The latter arrangement required that the machine operator halt the operation and install a different dressing finger for each of the areas, or utilize the same finger with appropriate shims or spacers. Intermixed terminal spacings in the same area and lying, for example, within the range accommodated by the present dressing finger, were not permitted.

It is apparent from the foregoing considerations that the present invention fills an important need in providing flexibility in the terminal layout design associated with automatic wiring machines.

SUMMARY OF THE INVENTION

In accordance with the present invention, an improved dressing finger is provided for use with an associated wrap tool in an automatic wiring machine. An actual operative embodiment of the finger, and its associated guide or sleeve, have been successfully used on a Gardner-Denver, Model 14FV machine. The mounting of the new dressing finger assembly on the machine is readily accomplished since it is an exact replacement for the old assembly.

It has been mentioned that in present day machines the distance relationship of the dressing finger to its associated wrap tool along one axis determines the terminal grid pattern. Thus, if the distance between finger and tool is 0.100 inches along the X axis, the X-Y grid size for terminals is fixed at 0.100 inches or multiples thereof. In contrast to the old dressing finger, whose central aperture was designed to encompass a terminal of standard dimensions situated in a uniform grid pattern, the dressing finger of the present invention contains a slotted aperture which is elongated in cross section and displaced from the finger central axis. The displacement and slot are positioned on the side of the finger opposite the wrap tool to accomodate the same terminal positioned through a range of grid spacings. In the above example, terminals spaced from 0.100 inches to 0.125 inches along the X axis, measured away from the tool, were successfully used without further modification of the machine or its program. With the old dressing finger, terminal spacings greater than the standard could not be tolerated because of the substantial misalignment of the respective center lines of the finger central aperture and the terminal. Other other features and advantages of the present invention will become apparent in the detailed description appearing hereinafter.

DESCRIPTION OF THE PREFERRED EMBODIMENT

Before proceeding with a description of the dressing finger of the present invention, it is believed helpful to review briefly the portion of a typical wire wrapping machine associated with the finger and to describe in simplified fashion the operation thereof. Accordingly, the Gardner-Denver machine, Model 14FV has been chosen for purposes of example and partial front view appears in FIG. 1, It should be understood, however, that the invention should not be considered limited to use with this machine.

Figure 1:
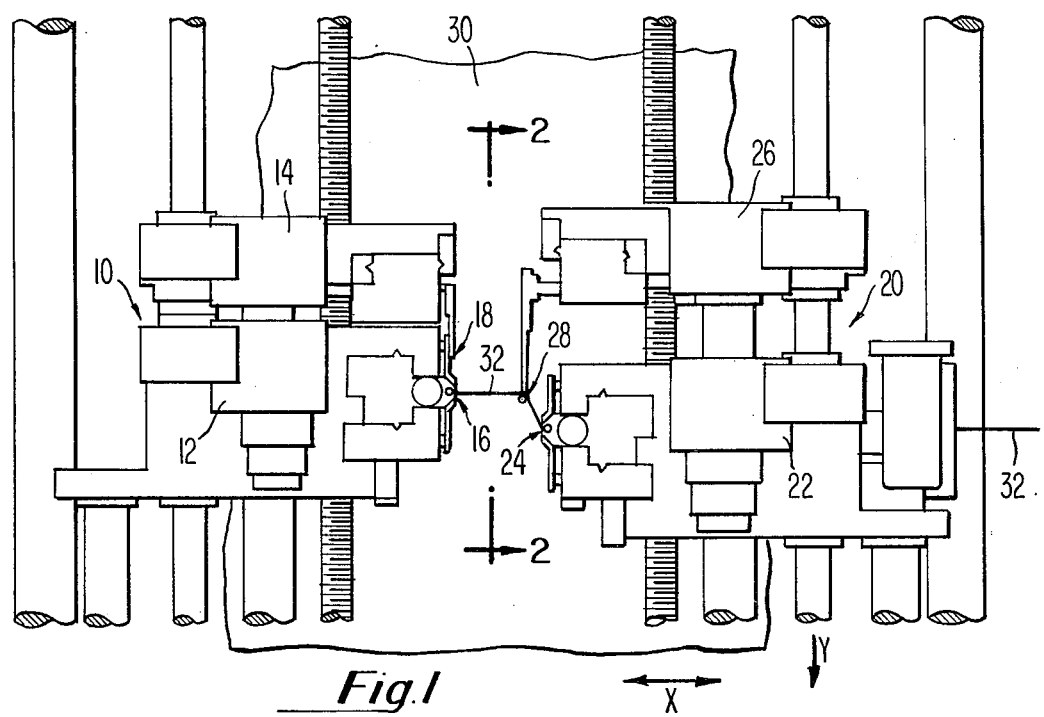
FIG. 1 is a partial front view of the aforementioned Gardner-Denver machine illustrating the relationship of the two sets of dressing fingers and wrap tool carriages to each other.

With reference to FIG. 1, there are depicted two sets of carriages — a left hand set 10 comprising a wrap tool carriage 12 and a dressing finger carriage 14. The former carriage includes a wrap tool or bit 16 while the latter bears a dressing finger 18. The right hand set of carriages 20 includes a wrap tool carriage 22 having a wrap tool 24 and a dressing finger carriage 26 with dressing finger 28. Both the sets of carriages 10 and 20 as well as the terminal panel 30 are oriented in vertical planes.

A simplified outline of carriage movements during operation includes the following. At the start of a wire pattern, the left hand carriages 10 and the right hand carriages 20 are grouped. This is accomplished by drive means (not shown) which are capable of moving the left hand set of carriages 10 toward the right hand set 20 along the X axis as indicated by the double-headed arrow. Wire 32 is fed into the left hand wrapping tool carriage 12 via the wire feed mechanism located in the right hand tool carriage 22. The end of the wire is then held by the left hand wrap tool 16. Next, additional X drive means (not shown) position the "locked-up" or coupled left and right sets of carriages 10 and 20 to a predetermined X axis location. At this point the sets of carriages are uncoupled and the right hand set of carriages 20 is locked in this last position.

If both dressing fingers 18 and 28 are to be used, the finger 28 in the right hand dressing finger carriage 26 is lowered ahead of the wire 32 and is locked at that position while the tool carriage 22 proceeds in a descending motion along the Y axis as indicated by the arrow to its proper location. This motion forms the wire around the dressing finger 28. The reason for locking the dressing finger at the desired location is that the dressing finger carriage 26 is not at any time physically connected to its associated wrap tool carriage 22 but makes contact therewith by gravitational force.

When this action has been completed, the left hand set of carriages 10 is moved to a predetermined X axis location by the aforementioned "additional X drive means". Then the left hand carriages 10 proceed through a sequence similar to that described for the right hand carriages 20 to position the dressing finger 18 and wrap tool 16. Obviously, this last operation is not required to form the wire pattern shown in FIG. 1, since only the right hand finger 28 is utilized.

At this point the wire pattern has been formed, in space above the terminals (not shown in FIG. 1) to be wrapped. Upon instruction of the machine program, the wrapping tool bits and the dressing fingers are lowered a prescribed distance over the terminals on the panel 30 and connections are made simultaneously to the two terminals under the respective wrap tools 16 and 24. When the wrapping has been completed, the tools and dressing fingers are retracted clear of the terminals. The left and right sets of carriages 10 and 20 are then regrouped as described hereinbefore to begin the next wire pattern cycle.

Figure 2:
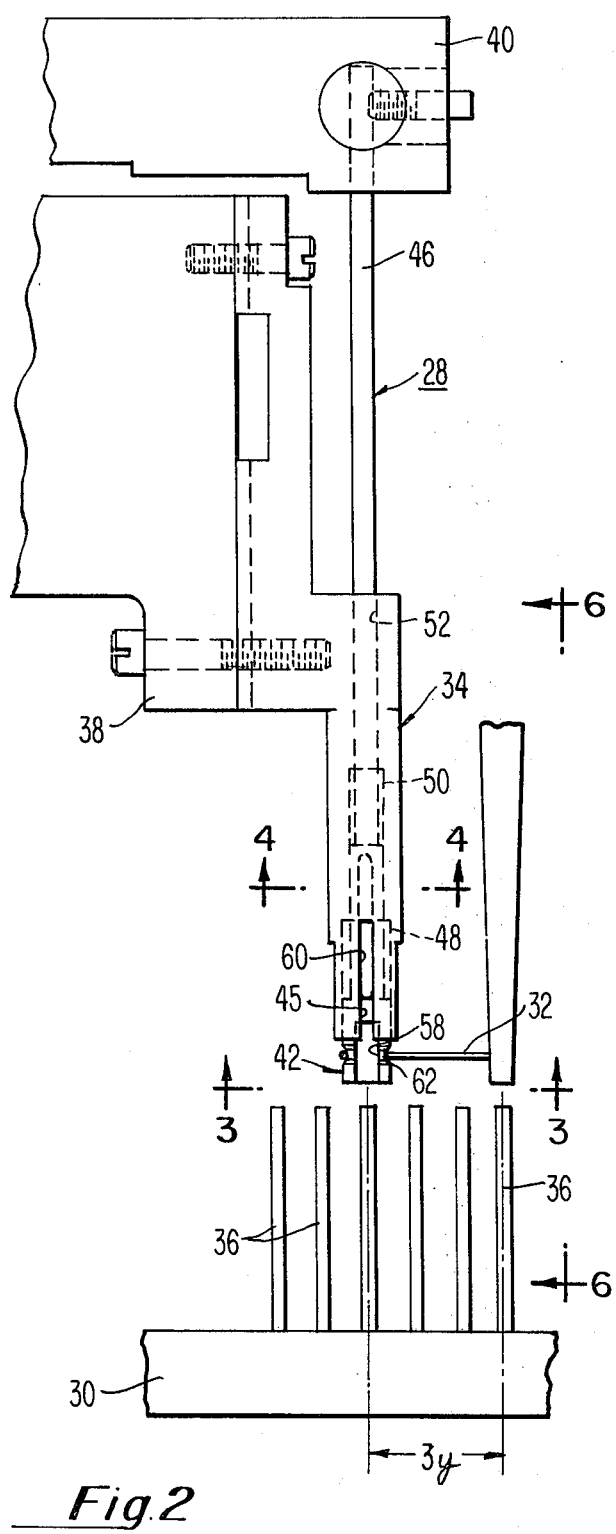
FIG. 2 is a section view taken along lines 2—2 of FIG. 1 and depicting details of the dressing finger assembly as well as its distance relation to its associated wrap tool in the Y axis direction.
Figure 5:
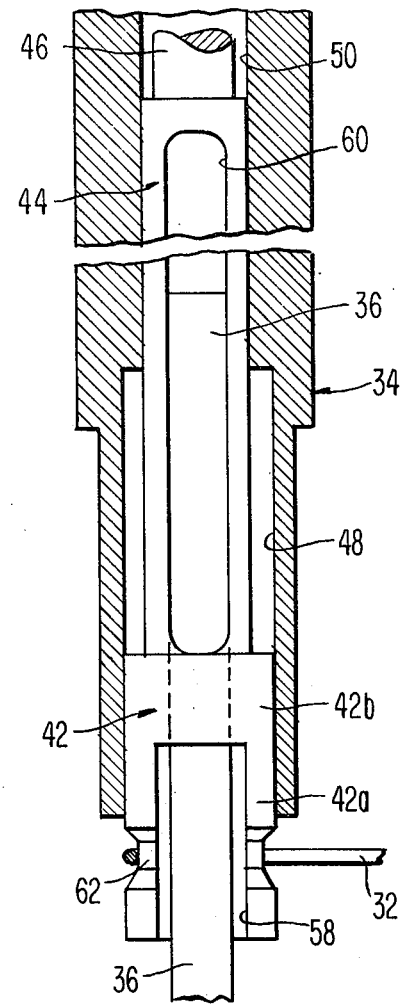
FIG. 5 is an enlarged partial view of the dressing finger assembly of FIG. 2, with portions of the sleeve cut away.
Figure 3:
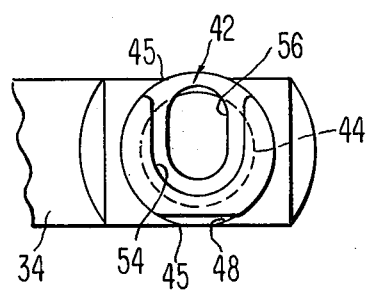
FIG. 3 is a section view taken along lines 3—3 of FIG. 2 depicting the elongated apertures within the dressing finger.
Figure 4:
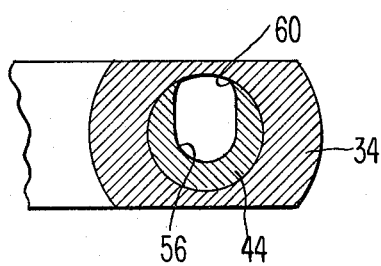
FIG. 4 is a section view taken along lines 4—4 of FIG. 2 and giving further structural details on the dressing finger within its support sleeve.

FIG. 2 is a section view taken along lines 2—2 of FIG. 1 and depicting the details of dressing finger 28 of the present invention. The relationship of the finger to the wrap tool 24 along the Y axis (see FIG. 1) and the relative positions of the finger 28 and tool 24 with respect to the terminals 34 on panel or board 30 are illustrated. The finger 28 is shown supported by a guide or sleeve 34. FIGS. 3 and 4 are section views taken respectively along the lines 3—3 and 4—4 of FIG. 2. FIG. 5 is an enlarged partial view of the dressing finger 28 lowered over a terminal 36 and with portions of the sleeve 34 cut away.

With general reference to FIG. 2 and specific reference to FIGS. 3, 4 and 5 where indicated, the dressing finger guide or sleeve 34 is shown connected to a pivot arm 38. The finger is fastened to a lever 40 capable of moving the finger within the sleeve. The finger, which is preferably fabricated of hardened steel, is comprised of three contiguous sections 42, 44 and 46. These sections include a pair of tubular sections 42 and 44 having respectively decreasing outside diameters — the smaller section 44 terminating in a solid shaft section 46 having even a lesser outside diameter than section 44. The sleeve 34 contains three contiguous concentric bores 48, 50 and 52 to accommodate respectively the three sections 42, 44 and 46 of the dressing finger 28. The rectangular cross section of the sleeve 34 containing the bore 48 is required by the machine design and terminal spacings to have a strict maximum width. Accordingly, bore 48 results in a slot being formed on opposite sides of the sleeve — the outer surface of section 42 filling the slot when placed within the bore. This maximizes the dimension of aperture 54 in part 42a of section 42 of the finger 28, without exceeding the width specification of the sleeve 34. The apertures 54 and 56 respectively in the tubular sections 42 and 44, as seen particularly in FIG. 3, are elongated in cross section and have their center lines displaced from the central axis of the dressing finger.

As seen in FIG. 5, section 42 is comprised of two parts 41a and 42b having respectively elongated coaxial apertures 54 and 56 (FIG. 3), the former being larger than the latter. The size of the larger aperture 54 and its displacement results in the formation of a substantially rectangular slot 58 in the wall of the first part 42a of section 42. Commencing with the second part 42b of section 42, a smaller opening 56 whose maximum inside dimension corresponds generally to the outside diameter of section 44 is present. This opening permits a narrow strip or band of material to remain over part 42b of section 42, which combined with the adjacent wall sections creates a retaining ring. This ring of material strengthens the dressing finger and helps to prevent its deformation during use. As to section 44, the eccentricity of the smaller opening 56 (FIG. 4) results in an axial slot 60 in one wall of section 44, along its entire length as seen in FIG. 5. The axial center line of this slot is in substantial alignment with slot 58 in part 42a of section 42. The slots 58 and 60 are a significant feature of the invention and their utility will become apparent in the description which follows. Part 42a of section 42 also contains a circumferential groove 62 to provide a retaining area for the wire 32 during the pattern formation.

With continued reference to FIG. 2, the dressing finger 28 and wrap tool 24 are shown displaced in the Y axis direction (as defined in FIG. 1) by three combined pin or terminal distances designated 3y. The slotted portion 58 of the dressing finger 28 is located on the side of the finger away from the wrap tool 24. In FIG. 2, the dressing finger 28 is shown in its active or pivoted down position, and lies a fixed distance x (in the X direction) in front of the wrap tool 24.

Figure 6:
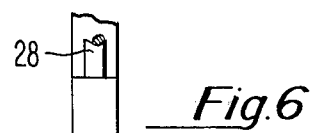
FIG. 6 is a section view taken along the lines 6—6 of FIG. 2, to illustrate the fixed distance relationship of the dressing finger to its associated wrap tool in the X axis direction.

FIG. 6 which is a view taken along lines 6—6 of FIG. 2 illustrates this fixed distance x. When the dressing fingers are not in use, as for example finger 18 in FIG. 1, they remain in an upright and retracted position such that they lie in the same plane as the associated wrap tool 16. However, as in the case of dressing finger 28, which is being used, the finger and its sleeve 34 are moved out a distance x (in the X direction) from its carriage 26, and then pivoted by arm 38 over and beyond the wire 32. The distance x is the fixed distance mentioned hereinbefore which, in the absence of the present invention, creates a limitation in the terminal grid design.

In FIG. 6, the distance x which is measured along the X axis between the center lines of the wrap tool 24 and dressing finger 28 is shown to be identical to the spacing between adjacent terminals 36. For example, the distance may be 0.100 inches.

Figure 8:
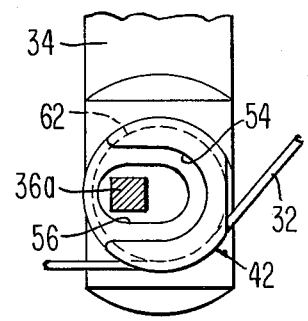
FIG. 8 illustrates the condition which exists when the terminal is displaced from the dressing finger center line.
Figure 7:
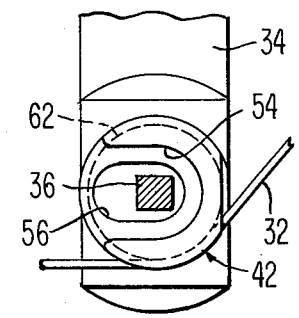
FIG. 7 is a section view taken along lines 7—7 of FIG. 6 to show the position of a terminal with respect to the dressing finger apertures when the terminal center line is coincident with that of the finger.

As has been mentioned previously, the dressing finger 28 carrying the wire 32 in a groove 62, together with the wrap tools 16 and 24 are lowered over the terminals to a prescribed level to accomplish the wire wrap connections. In the case of grid terminal spacings identical to the distance x between the dressing finger 28 and wrap tool 24, as seen in FIG. 6, the view in FIG. 7 applies. The terminal 36 is shown in relation to the elongated openings 54 and 56. For purpose of comparison, the terminal cross section is assumed to be 0.025 inches square. The center line of the terminal 36 is coincident with the vertical center line of the dressing finger 28. It is apparent that no clearance difficulty will be encountered when the dressing finger 28 of the present invention is lowered over the terminal 36. But the utility of the present finger lies in its ability to accommodate grid terminal spacings which are somewhat greater than that permitted by the tool-to-finger distance x. In FIG. 8, the fixed distance x remains the same as in FIGS. 6 and 7, but the terminal 36a is positioned farther away in the X direction from the wrap tool 24. If, for example, the fixed distance x is 0.100 inches, the distance of the terminal 36a from its associated wrap tool may be approximately 0.125 inches. As is evident in FIG. 8, although the terminal center line has been displaced a distance 0.025 inches away from the dressing finger central axis the provision of the elongated apertures 54 and 56 prevents any interference problem. It should be observed that the larger aperture 54 and the slot 58 in section 42a of the dressing finger are effective in accommodating a previous wrap which may be present on terminal 36a, as the finger is lowered thereover. In fact, the wire wrap may extend beyond or protrude from slot 58 without adverse effects. The range of terminal distance deviation from the fixed distance x is determined by the physical limitations of the dressing finger itself. Present day dressing fingers which utilize a central circular aperture, are unable to accept such variations in grid terminal spacings. It is obvious that given the situation depicted in FIG. 8, such a dressing finger would probably impact the terminal 36a rather than clear it as does the present finger.

At approximately the conclusion of the wrap operation, the lever 40 retracts the dressing finger 28 into sleeve 34 causing the latter to push the wire 32 out of groove 62. This action permits the wire to remain on substantially the same plane as the wire wraps being accomplished. Subsequently, the entire assembly including arm 38 is withdrawn from the terminals to commence the next pattern-forming cycle.

Figure 9:
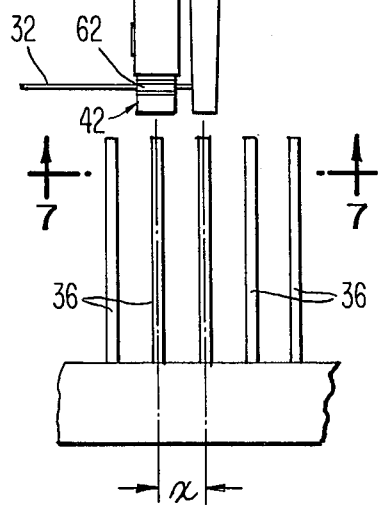
FIG. 9 is an enlarged view of the wiring pattern depicted in FIG. 1.
Figure 9:
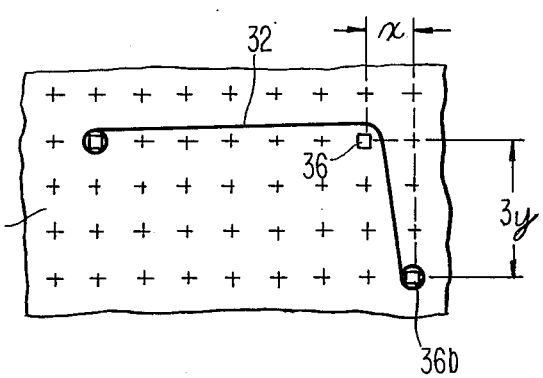

FIG. 9 is an enlarged view of the wiring pattern seen in FIG. 1. With additional reference to FIG. 2 it may be noted that the distance, in the Y axis direction between the terminal 36 over which the dressing finger 28 was positioned and the wrapped terminal 36b is equivalent to the combined three terminal distances 3y. In similar fashion, and observing FIG. 6, the distance in the X axis direction between terminal 36 and the wrapped terminal 36b is one terminal spacing, or a distance x.

In conclusion, it should be noted that although the previous description outlines a specific design for a particular machine, the basic principles taught herein may be applied to other similar automatic machines which nevertheless differ somewhat in construction or operation. The variation in terminal grid size permitted by the present invention is also dependent upon the particular machine, such as for example, a larger grid machine will use larger wire and having physically larger dressing fingers. Also, if the fixed distance from the dressing finger mechanism to the wrap tool is physically altered, then the new design will accommodate terminal grids or a mixture of terminal grids over a range using the new fixed distance as a base or minimum distance.

It is submitted that the dressing finger of the present invention offers a convenient, economical, time saving means of increasing the flexibility of panel design. As noted hereinbefore, changes and modifications of the dressing finger may be needed to suit particular requirements. Such variations as are within the skill of the designer, and which do not depart from the true scope and spirit of the invention are intended to be covered by the following claims.

What is claimed is:

1. A dressing finger assembly for use on automatic wiring machines to provide a predetermined pattern in a wire being connected to a terminal by an associated wrap tool, comprising:
   a dressing finger having a plurality of contiguous, coaxial, cylindrical sections arranged in order of decreasing outside diameters,
   a first and a second of said sections having respectively the largest and next largest diameters of said plurality of sections and being tubular, said first and second sections having coaxial apertures which are elongated in cross section and have their center lines displaced from the central longitudinal axis of said sections, the aperture in at least a first part of said first section having larger dimensions than the aperture in said second section, the size and displacement of each of said apertures being such that a longitudinal slot is formed in the wall of each of said sections, the axial center lines of the slots in said first and second sections being in substantial alignment.

2. A dressing finger assembly as defined in claim 1 further characterized in that the elongated aperture in a second part of said first section, which second part adjoins said second section, is dimensionally identical to the aperture in said last mentioned section; the outside diameter of said first section and the maximum dimension of the aperture in said second part being such that the outside wall structure covering said second part remains intact, thereby providing a ring-like member surrounding said second part to strengthen said dressing finger.

3. A dressing finger assembly as defined in claim 2 wherein said first part of said first section contains a circumferential groove for holding said wire during the pattern-forming operation.

4. A dressing finger assembly as defined in claim 3 wherein said plurality of sections include a third section of minimum outside diameter adjoining said second section, said third section being a solid shaft-like member.

5. A dressing finger assembly as defined in claim 4 further including a sleeve for supporting said dressing finger, said sleeve having a plurality of contiguous concentric bores for accommodating respectively the plurality of dressing finger sections.

6. A dressing finger assembly as defined in claim 5 further characterized in that said sleeve has a substantially rectangular cross section in the bore area which accommodates said first section of said dressing finger, the bore diameter being greater than the minimum rectangular dimension of said sleeve such that narrow slots are generated by said bore on respective opposite sides of said sleeve, the outer wall surface of said first section substantially filling said slots when positioned within said bore.

7. A dressing finger assembly as defined in claim 6 wherein said slots in said first and second sections of said dressing finger coincide with the slot on the side of said sleeve which lies away from said wrap tool.

8. A dressing finger assembly as defined in claim 7 further including a pivot arm connected to said sleeve, and a lever connected to the free end of said third section of said dressing finger, said lever being capable of extending said dressing finger beyond the extremity of said sleeve to receive said wire and retracting it within said sleeve to push the wire from said finger.

9. A dressing finger assembly as defined in claim 8 further characterized in that said dressing finger and said wrap tool are positioned a fixed distance from each other in one of two coordinate axes, said elongated apertures in said first and second sections of said dressing finger accommodating a terminal grid having terminals separated from each other by a distance which lies within a predetermined range and has said fixed distance as a minimum.

10. A dressing finger assembly as defined in claim 9 wherein said fixed distance is 0.100 inches and said range includes distances from 0.100 to 0.125 inches.

* * * * *